(12) United States Patent
Liao et al.

(10) Patent No.: US 8,674,433 B2
(45) Date of Patent: Mar. 18, 2014

(54) SEMICONDUCTOR PROCESS

(75) Inventors: Chin-I Liao, Tainan (TW); Chia-Lin Hsu, Tainan (TW); Ming-Yen Li, Taichung (TW); Hsin-Huei Wu, Chiayi (TW); Yung-Lun Hsieh, Tainan (TW); Chien-Hao Chen, Yun-Lin County (TW); Bo-Syuan Lee, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 147 days.

(21) Appl. No.: 13/216,259

(22) Filed: Aug. 24, 2011

(65) Prior Publication Data

US 2013/0052778 A1   Feb. 28, 2013

(51) Int. Cl.
*H01L 29/66* (2006.01)

(52) U.S. Cl.
USPC ............ 257/327; 257/368; 257/628; 438/197

(58) Field of Classification Search
USPC .......... 257/347, 368, 401, 628, 327; 438/186, 438/197, 294, 585
See application file for complete search history.

(56) References Cited

U.S. PATENT DOCUMENTS

| 4,891,303 | A | 1/1990 | Garza |
|---|---|---|---|
| 5,217,910 | A | 6/1993 | Shimizu |
| 5,273,930 | A | 12/1993 | Steele |
| 5,356,830 | A | 10/1994 | Yoshikawa |
| 5,372,957 | A | 12/1994 | Liang |
| 5,385,630 | A | 1/1995 | Philipossian |
| 5,399,506 | A | 3/1995 | Tsukamoto |
| 5,625,217 | A | 4/1997 | Chau |
| 5,777,364 | A | 7/1998 | Crabbe |
| 5,783,478 | A | 7/1998 | Chau |
| 5,783,479 | A | 7/1998 | Lin |
| 5,960,322 | A | 9/1999 | Xiang |
| 6,030,874 | A | 2/2000 | Grider |
| 6,043,138 | A | 3/2000 | Ibok |
| 6,048,756 | A | 4/2000 | Lee |
| 6,074,954 | A | 6/2000 | Lill |
| 6,100,171 | A | 8/2000 | Ishida |
| 6,110,787 | A | 8/2000 | Chan |
| 6,165,826 | A | 12/2000 | Chau |
| 6,165,881 | A | 12/2000 | Tao |
| 6,191,052 | B1 | 2/2001 | Wang |
| 6,228,730 | B1 | 5/2001 | Chen |

(Continued)

OTHER PUBLICATIONS

Kavalieros et al., "Tri-Gate Transistor Architecture With High-k Gate Dielectrics, Metal Gates and Strain Engineering", Intel Corporation Components Research Technology Manufacturing Group Jun. 13, 2006, p. 12.

*Primary Examiner* — Kimberly Rizkallah
*Assistant Examiner* — Errol Fernandes
(74) *Attorney, Agent, or Firm* — Winston Hsu; Scott Margo

(57) ABSTRACT

A semiconductor process includes the following steps. A substrate is provided. At least a fin-shaped structure is formed on the substrate. An oxide layer is formed on the substrate without the fin-shaped structure being formed thereon. A gate is formed to cover a part of the oxide layer and a part of the fin-shaped structure. An etching process is performed to etch a part of the fin-shaped structure beside the gate, therefore at least a recess is formed in the fin-shaped structure. An epitaxial process is performed to form an epitaxial layer in the recess, wherein the epitaxial layer has a hexagon-shaped profile structure.

13 Claims, 5 Drawing Sheets

(56) References Cited

U.S. PATENT DOCUMENTS

| | | | |
|---|---|---|---|
| 6,274,447 B1 | 8/2001 | Takasou | |
| 6,355,533 B2 | 3/2002 | Lee | |
| 6,365,476 B1 | 4/2002 | Talwar | |
| 6,368,926 B1 | 4/2002 | Wu | |
| 6,444,591 B1 | 9/2002 | Schuegraf | |
| 6,492,216 B1 | 12/2002 | Yeo | |
| 6,537,370 B1 | 3/2003 | Hernandez | |
| 6,544,822 B2 | 4/2003 | Kim | |
| 6,605,498 B1 | 8/2003 | Murthy | |
| 6,613,695 B2 | 9/2003 | Pomarede | |
| 6,621,131 B2 | 9/2003 | Murthy | |
| 6,624,068 B2 | 9/2003 | Thakar | |
| 6,632,718 B1 | 10/2003 | Grider | |
| 6,642,122 B1 | 11/2003 | Yu | |
| 6,664,156 B1 | 12/2003 | Ang | |
| 6,676,764 B2 | 1/2004 | Joo | |
| 6,699,763 B2 | 3/2004 | Grider | |
| 6,703,271 B2 | 3/2004 | Yeo | |
| 6,777,275 B1 | 8/2004 | Kluth | |
| 6,806,151 B2 | 10/2004 | Wasshuber | |
| 6,809,402 B1 | 10/2004 | Hopper | |
| 6,858,506 B2 | 2/2005 | Chang | |
| 6,861,318 B2 | 3/2005 | Murthy | |
| 6,864,135 B2 | 3/2005 | Grudowski | |
| 6,869,867 B2 | 3/2005 | Miyashita | |
| 6,887,751 B2 | 5/2005 | Chidambarrao | |
| 6,887,762 B1 | 5/2005 | Murthy | |
| 6,891,192 B2 | 5/2005 | Chen | |
| 6,921,963 B2 | 7/2005 | Krivokapic | |
| 6,930,007 B2 | 8/2005 | Bu | |
| 6,946,350 B2 | 9/2005 | Lindert | |
| 6,962,856 B2 | 11/2005 | Park | |
| 6,972,461 B1 | 12/2005 | Chen | |
| 6,991,979 B2 | 1/2006 | Ajmera | |
| 6,991,991 B2 | 1/2006 | Cheng | |
| 7,037,773 B2 | 5/2006 | Wang | |
| 7,060,576 B2 | 6/2006 | Lindert | |
| 7,060,579 B2 | 6/2006 | Chidambaram | |
| 7,087,477 B2 | 8/2006 | Fried | |
| 7,091,551 B1 | 8/2006 | Anderson | |
| 7,112,495 B2 | 9/2006 | Ko | |
| 7,118,952 B2 | 10/2006 | Chen | |
| 7,132,338 B2 | 11/2006 | Samoilov | |
| 7,169,675 B2 | 1/2007 | Tan | |
| 7,183,596 B2 | 2/2007 | Wu | |
| 7,202,124 B2 | 4/2007 | Fitzgerald | |
| 7,217,627 B2 | 5/2007 | Kim | |
| 7,247,887 B2 | 7/2007 | King | |
| 7,250,658 B2 | 7/2007 | Doris | |
| 7,288,822 B1 | 10/2007 | Ting | |
| 7,303,999 B1 | 12/2007 | Sriraman | |
| 7,309,626 B2 | 12/2007 | Ieong | |
| 7,335,959 B2 | 2/2008 | Curello | |
| 7,352,034 B2 | 4/2008 | Booth, Jr. | |
| 7,410,859 B1 | 8/2008 | Peidous | |
| 7,462,239 B2 | 12/2008 | Brabant | |
| 7,470,570 B2 | 12/2008 | Beintner | |
| 7,491,615 B2 | 2/2009 | Wu | |
| 7,494,856 B2 | 2/2009 | Zhang | |
| 7,494,858 B2 | 2/2009 | Bohr | |
| 7,531,437 B2 | 5/2009 | Brask | |
| 7,569,857 B2 | 8/2009 | Simon | |
| 7,592,231 B2 | 9/2009 | Cheng | |
| 7,667,227 B2 | 2/2010 | Shimamune | |
| 7,691,752 B2 | 4/2010 | Ranade | |
| 7,838,370 B2 | 11/2010 | Mehta | |
| 2002/0011612 A1* | 1/2002 | Hieda | 257/262 |
| 2002/0160587 A1 | 10/2002 | Jagannathan | |
| 2002/0182423 A1 | 12/2002 | Chu | |
| 2003/0181005 A1 | 9/2003 | Hachimine | |
| 2003/0203599 A1 | 10/2003 | Kanzawa | |
| 2004/0045499 A1 | 3/2004 | Langdo | |
| 2004/0067631 A1 | 4/2004 | Bu | |
| 2004/0195624 A1 | 10/2004 | Liu | |
| 2004/0227164 A1 | 11/2004 | Lee | |
| 2005/0051825 A1 | 3/2005 | Fujiwara | |
| 2005/0070076 A1 | 3/2005 | Dion | |
| 2005/0079692 A1 | 4/2005 | Samoilov | |
| 2005/0082616 A1 | 4/2005 | Chen | |
| 2005/0139231 A1 | 6/2005 | Abadie | |
| 2005/0156171 A1* | 7/2005 | Brask et al. | 257/72 |
| 2005/0260830 A1 | 11/2005 | Kwon | |
| 2005/0285193 A1 | 12/2005 | Lee | |
| 2005/0287752 A1 | 12/2005 | Nouri | |
| 2006/0051922 A1 | 3/2006 | Huang | |
| 2006/0057859 A1 | 3/2006 | Chen | |
| 2006/0076627 A1 | 4/2006 | Chen | |
| 2006/0088968 A1 | 4/2006 | Shin | |
| 2006/0099830 A1 | 5/2006 | Walther | |
| 2006/0115949 A1 | 6/2006 | Zhang | |
| 2006/0163558 A1 | 7/2006 | Lee | |
| 2006/0228842 A1 | 10/2006 | Zhang | |
| 2006/0231826 A1 | 10/2006 | Kohyama | |
| 2006/0258126 A1 | 11/2006 | Shiono | |
| 2006/0281288 A1 | 12/2006 | Kawamura | |
| 2006/0286729 A1 | 12/2006 | Kavalieros | |
| 2006/0292779 A1 | 12/2006 | Chen | |
| 2006/0292783 A1 | 12/2006 | Lee | |
| 2007/0023847 A1 | 2/2007 | Rhee | |
| 2007/0034906 A1 | 2/2007 | Wang | |
| 2007/0049014 A1 | 3/2007 | Chen | |
| 2007/0072353 A1 | 3/2007 | Wu | |
| 2007/0072376 A1 | 3/2007 | Chen | |
| 2007/0082451 A1 | 4/2007 | Samoilov | |
| 2007/0108528 A1 | 5/2007 | Anderson | |
| 2007/0128783 A1 | 6/2007 | Ting | |
| 2007/0158756 A1 | 7/2007 | Dreeskornfeld | |
| 2007/0166929 A1 | 7/2007 | Matsumoto | |
| 2007/0262396 A1 | 11/2007 | Zhu | |
| 2008/0014688 A1 | 1/2008 | Thean | |
| 2008/0061366 A1 | 3/2008 | Liu | |
| 2008/0067545 A1 | 3/2008 | Rhee | |
| 2008/0076236 A1 | 3/2008 | Chiang | |
| 2008/0085577 A1 | 4/2008 | Shih | |
| 2008/0116525 A1 | 5/2008 | Liu | |
| 2008/0124874 A1 | 5/2008 | Park | |
| 2008/0128746 A1 | 6/2008 | Wang | |
| 2008/0142886 A1 | 6/2008 | Liao | |
| 2008/0157208 A1 | 7/2008 | Fischer | |
| 2008/0220579 A1 | 9/2008 | Pal | |
| 2008/0233722 A1 | 9/2008 | Liao | |
| 2008/0233746 A1 | 9/2008 | Huang | |
| 2009/0039389 A1 | 2/2009 | Tseng | |
| 2009/0045456 A1 | 2/2009 | Chen | |
| 2009/0095992 A1 | 4/2009 | Sanuki | |
| 2009/0117715 A1 | 5/2009 | Fukuda | |
| 2009/0124056 A1 | 5/2009 | Chen | |
| 2009/0124097 A1 | 5/2009 | Cheng | |
| 2009/0166625 A1 | 7/2009 | Ting | |
| 2009/0184402 A1 | 7/2009 | Chen | |
| 2009/0186475 A1 | 7/2009 | Ting | |
| 2009/0242964 A1 | 10/2009 | Akil | |
| 2009/0246922 A1 | 10/2009 | Wu | |
| 2009/0269916 A1 | 10/2009 | Kang | |
| 2009/0278170 A1 | 11/2009 | Yang | |
| 2009/0302348 A1 | 12/2009 | Adam | |
| 2010/0001317 A1 | 1/2010 | Chen | |
| 2010/0048027 A1 | 2/2010 | Cheng | |
| 2010/0052059 A1* | 3/2010 | Lee | 257/368 |
| 2010/0072553 A1 | 3/2010 | Xu | |
| 2010/0093147 A1 | 4/2010 | Liao | |
| 2010/0144121 A1 | 6/2010 | Chang | |
| 2010/0167506 A1 | 7/2010 | Lin | |
| 2011/0147828 A1* | 6/2011 | Murthy et al. | 257/327 |
| 2011/0147842 A1* | 6/2011 | Cappellani et al. | 257/365 |
| 2012/0161238 A1* | 6/2012 | Scheiper et al. | 257/368 |
| 2012/0299099 A1* | 11/2012 | Huang et al. | 257/347 |

* cited by examiner

SEMICONDUCTOR PROCESS

BACKGROUND OF THE INVENTION

1. Field of the Invention

The present invention relates generally to a semiconductor process, and more specifically, to a semiconductor process that forms at least a recess in a fin-shaped structure beside a gate structure, thereby forming an epitaxial layer having a hexagon-shaped profile structure in the recess.

2. Description of the Prior Art

With increasing miniaturization of semiconductor devices, various Fin-shaped field effect transistor (FinFET) devices have been developed. The Fin-shaped field effect transistor (FinFET) is advantageous for the following reasons. First, manufacturing processes of Fin-shaped field effect transistor (FinFET) devices can be integrated into traditional logic device processes, and thus are more compatible. In addition, since the three-dimensional structure of the FinFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

In a current FinFET process, a gate structure (which may include a gate dielectric layer, a gate electrode located on the gate dielectric layer, a cap layer located on the gate electrode, and a spacer located beside the gate dielectric layer, the gate electrode and the cap layer) is formed on a substrate having at least a fin-shaped structure. Then, epitaxial layers are formed on the fin-shaped structure beside the gate structure. Thereafter, other processes such as removing spacers of the gate structure may be performed.

However, the epitaxial layers make removal of the spacers difficult. The distance between the epitaxial layers on either side of the gate structure is also too great, resulting in insufficient stress forcing the gate channel below the gate structure, and limited ability to enhance carrier mobility of the gate channel through the epitaxial layers.

Therefore, a semiconductor process, more specifically a FinFET process, which can improve the performance of the epitaxial layers is needed in the industry.

SUMMARY OF THE INVENTION

The present invention provides a semiconductor process, that can etch and form at least a recess in a fin-shaped structure beside a gate structure, so that form an epitaxial layer having a hexagon-shaped profile structure in the recess, therefore a Multi-gate MOSFET such as a FinFET or a Tri-gate MOSFET can be formed.

The present invention provides a semiconductor process including the following steps. A substrate is provided. At least a fin-shaped structure is formed on the substrate. An oxide layer is formed on the substrate without the fin-shaped structure being formed thereon. A gate covering a part of the oxide layer and a part of the fin-shaped structure is formed. An etching process is performed to etch a part of the fin-shaped structure beside the gate, therefore forming at least a recess in the fin-shaped structure. An epitaxial process is performed to form an epitaxial layer in the recess, wherein the epitaxial layer has a hexagon-shaped profile structure.

The present invention provides a semiconductor process, that etches at least a recess having a specific profile structure in the fin-shaped structure beside the gate structure. Thus, an epitaxial layer having a hexagon-shaped profile structure can be formed in the recess, and the performance of the semiconductor structure can therefore be improved. For example, the epitaxial layer formed in the present invention can make spacers easier to be removed. Besides, the epitaxial layer formed in the present invention can be easier to force stresses to the gate channel below the gate structure, so that improving the carrier mobility in the gate channel.

These and other objectives of the present invention will no doubt become obvious to those of ordinary skill in the art after reading the following detailed description of the preferred embodiment that is illustrated in the various figures and drawings.

DETAILED DESCRIPTION

Figure 9:
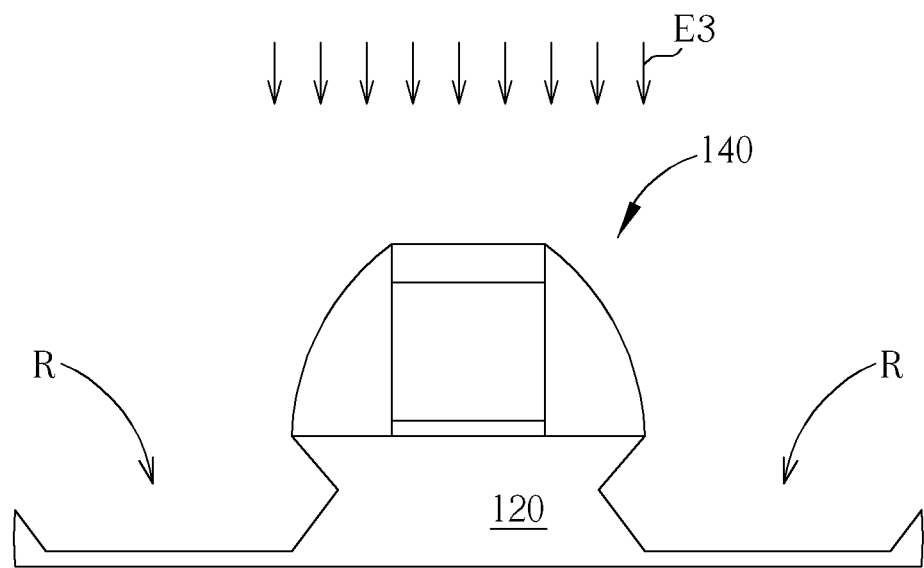
FIG. 9 schematically depicts a cross-sectional view of a semiconductor process along line A-A' and above the plane S of FIG. 7.
Figure 10:
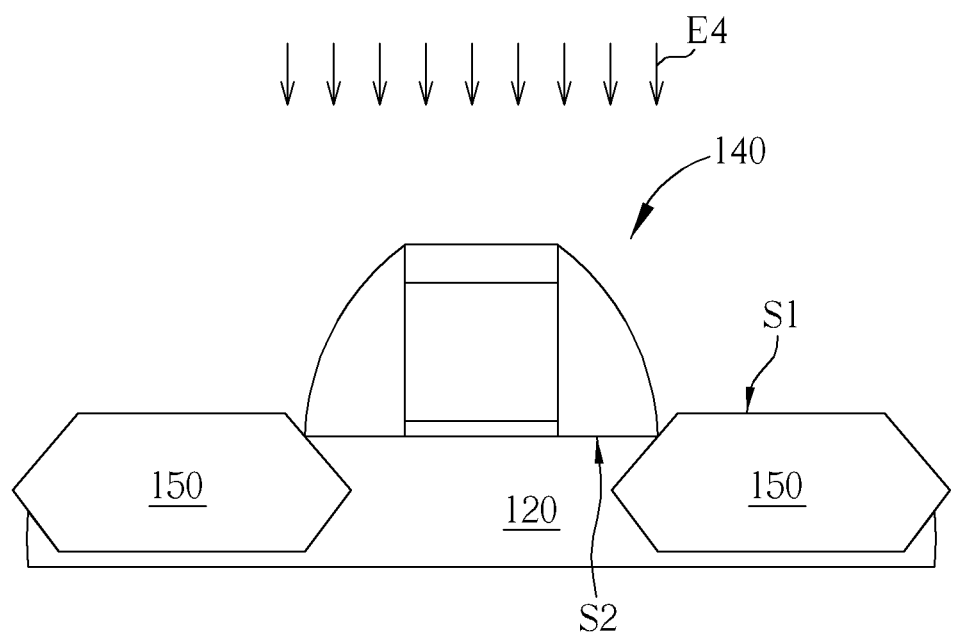
FIG. 10 schematically depicts a cross-sectional view of a semiconductor process along line A-A' and above the plane S of FIG. 8.

FIGS. 1-8 schematically depict a stereo view of a semiconductor process according to one preferred embodiment of the present invention. FIG. 9 schematically depicts a cross-sectional view of a semiconductor process along line A-A' and above the plane S of FIG. 7. FIG. 10 schematically depicts a cross-sectional view of a semiconductor process along line A-A' and above the plane S of FIG. 8. The semiconductor process of the present invention is suited for application to a bulk substrate or a silicon-on-insulator substrate.

Figure 1:
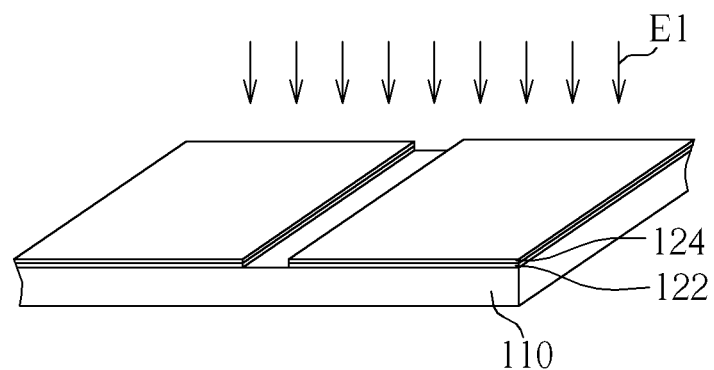
FIG. 1-8 schematically depict a stereo view of a semiconductor process according to one preferred embodiment of the present invention.
Figure 2:
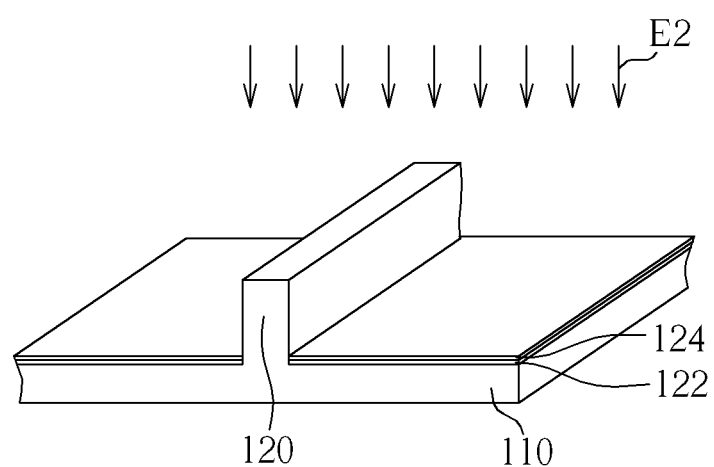
Figure 3:
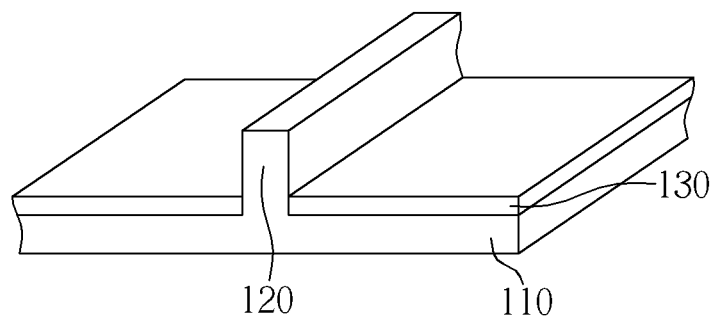

Please refer to FIGS. 1-3. As shown in FIG. 1, a substrate 110 is provided, wherein the substrate 110 is a bulk substrate, for example. A mask layer (not shown) is formed on the substrate, wherein the mask layer includes a pad oxide layer (not shown) and a nitride layer (not shown) located on the pad oxide layer. A photolithography process E1 is performed to pattern the mask layer for forming a patterned pad oxide layer 122 and a patterned nitride layer 124 and exposing a part of the substrate 110. As shown in FIG. 2, an epitaxial process E2 is performed to form a fin-shaped structure 120 on the exposed part of the substrate 110, wherein the fin-shaped structure 120 protrudes from the pad oxide layer 122 and the nitride layer 124. In addition, a photolithography process can be performed on the substrate 110 by using the mask layer already patterned as a hard mask, so that desired fin-shaped structures can be formed from the part of the substrate 110 that is not etched. As shown in FIG. 3, the patterned pad oxide layer 122 and the patterned nitride layer 124 are removed. An oxide layer 130 is formed on the substrate 110 without the fin-shaped structure 120 being formed thereon, wherein the oxide layer 130 may be formed by processes such as a depositing process and an etching back process, for use as a shallow trench isolation structure. In another embodiment, the oxide layer 130 may also be an isolation structure. By doing this, a fin-shaped structure 120 can be formed on the substrate 110, and an oxide layer 130 can be formed on the substrate 110 without the fin-shaped structure 120 being formed thereon.

Figure 4:
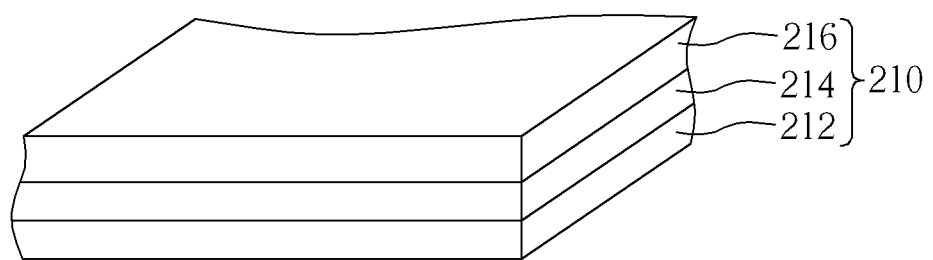
Figure 5:
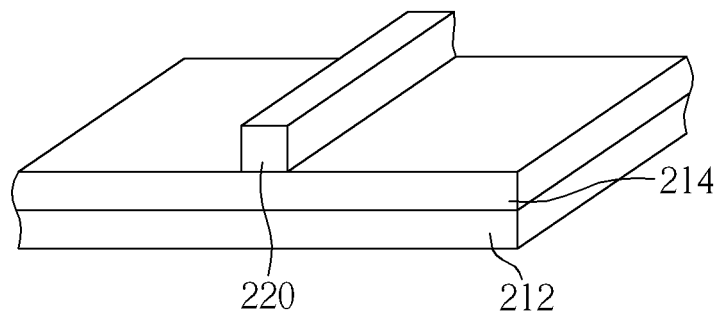

Additionally, please refer to FIGS. 4-5, which schematically depict another forming method of this embodiment. As shown in FIG. 4, a silicon-on-insulator substrate 210 is provided, which includes a silicon substrate 212, a bottom oxide layer 214 located on the silicon substrate 212 and a silicon layer 216 located on the bottom oxide layer 214. As shown in FIG. 5, the silicon layer 216 is patterned to form the fin-shaped structures 220 and a part of the bottom oxide layer 214 without exposing the fin-shaped structure 220 formed thereon. In this way, the fin-shaped structure 220 can also be formed on the silicon substrate 212, and an oxide layer (such as the bottom oxide layer 214) can be formed on the silicon substrate 212 without the fin-shaped structure 220 being formed thereon. The difference between FIG. 3 and FIG. 5 is: the oxide layer 130 formed on the silicon substrate 110 is just located on the substrate 110 without the fin-shaped structure 120 being formed thereon (as shown in FIG. 3), but the bottom oxide layer 214 formed in the silicon-on-insulator substrate 210 has the fin-shaped structure 220 located thereon. However, the difference does not affect later semiconductor processes of the present invention. This embodiment depicts a single fin-shaped structure 120 or 220 to illustrate the semiconductor process of the present invention, but the semiconductor process of the present invention can also be applied to a substrate having a plurality of fin-shaped structures.

Figure 6:
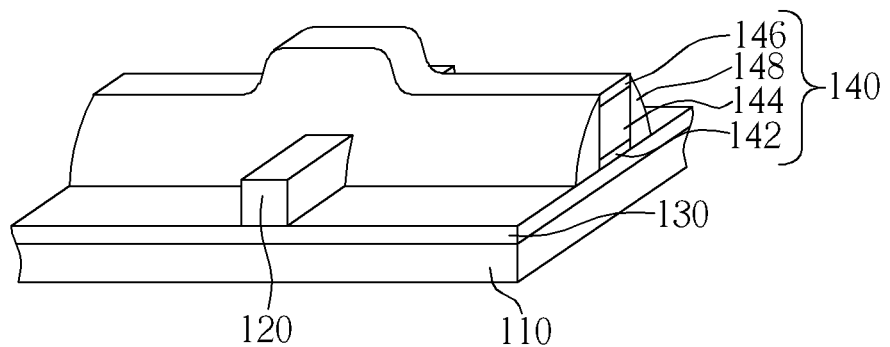

As shown in FIG. 6, a gate 140 is formed to cover a part of the oxide layer 130 and a part of the fin-shaped structure 120. The forming method of the gate 140 may include: forming a gate dielectric layer 142 covering a part of the oxide layer 130 and a part of the fin-shaped structure 120; forming a gate electrode layer 144 covering the gate dielectric layer 142; forming a cap layer 146 covering the gate electrode layer 144; patterning the cap layer 146, the gate electrode layer 144 and the gate dielectric layer 142; and forming a spacer 148 beside the pattern gate dielectric layer 142, gate electrode layer 144 and cap layer 146. In one embodiment, the material of the gate dielectric layer 142 may include silicon dioxide, silicon nitride, silicon oxynitride, high-k dielectric material such as metallic oxide, etc. The material of the gate electrode layer 144 may include heavily doped polysilicon, metallic oxide silicon, or metal alloys for forming a metal gate by a gate first process, such as metallic oxide silicon, titanium, tantalum, titanium nitride, tantalum nitride, or tungsten, etc. In one case, if the gate electrode layer 144 of the gate structure 140 is a polysilicon electrode layer, a replacement metal gate (RMG) process, such as a gate-last process, can be performed to replace the polysilicon electrode layer with the metal electrode layer. The cap layer 146 and the spacer 148 may be composed of silicon nitride. The spacer 148 may be a multi-layer structure (not shown) including the inner spacer and an outer spacer. The forming methods of the gate 140 are known in the art, and not described herein.

Figure 7:
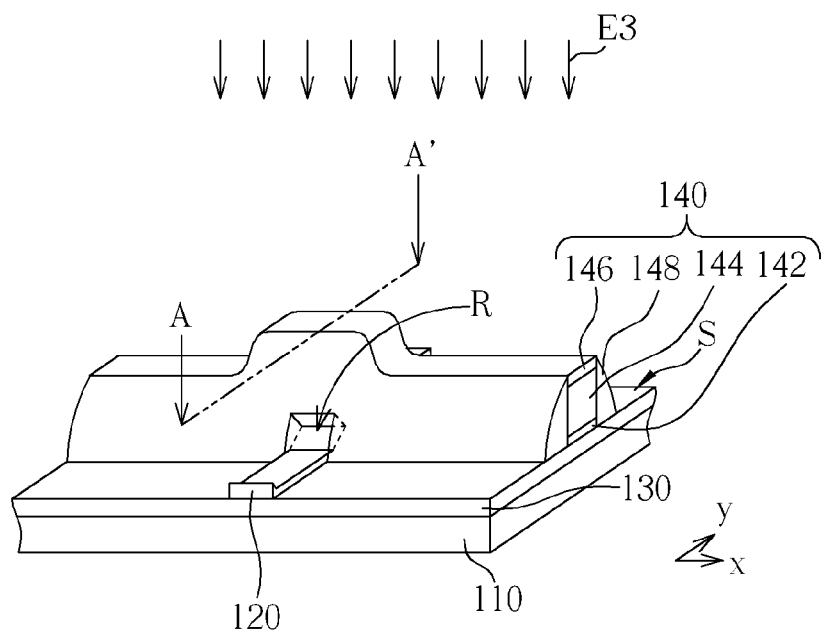

As shown in FIG. 7, an etching process E3 is performed to etch a part of the fin-shaped structure 120 beside the gate 140, so that a recess R in the fin-shaped structure 120 is formed on either side of the gate 140 respectively. In the present invention, the etching process E3 may include a dry etching process or a wet etching process. In a preferred embodiment, the etching process E3 may include a dry etching process and a wet etching process, or at least one wet etching process. In one case, the wet etching process comprises etching by an etchant containing ammonia, hydrogen peroxide and water, which performs at least an etching process to form the recess R using the characteristic of different etching rates applied to various crystal planes of the fin-shaped structure 120. Furthermore, the desired shape of the recess R can be attained by adjusting the ratio of ammonia, hydrogen peroxide and water in the etchant. In another embodiment, the recess R may be obtained by performing a wet etching process one or more times using different etchants, wherein the etchants may be ammonia etchant, methyl ammonium hydroxide etchant, hydroxide etchant, or ethylene diamine pyrocatechol etchant, etc. Therefore, the present invention can form the recess R having a hexagon-shaped profile structure.

In this embodiment, the recess R formed by the etching process will pass through the short axis X of the fin-shaped structure 120, but will not pass through the long axis y of the fin-shaped structure 120, therefore a source/drain region can be formed in the recess R. FIG. 9 schematically depicts a cross-sectional view of a semiconductor process along line A-A' and above the plane S of FIG. 7. As shown in FIG. 9, the recess R located in a part of the fin-shaped structure 120 beside the gate 140 is formed by the etching process E3, wherein the recess R has a hexagon-shaped profile structure. In this embodiment, a part of the fin-shaped structure 120 will be reserved below the recess R for forming an epitaxial layer in the recess R by a later epitaxial process.

Figure 8:
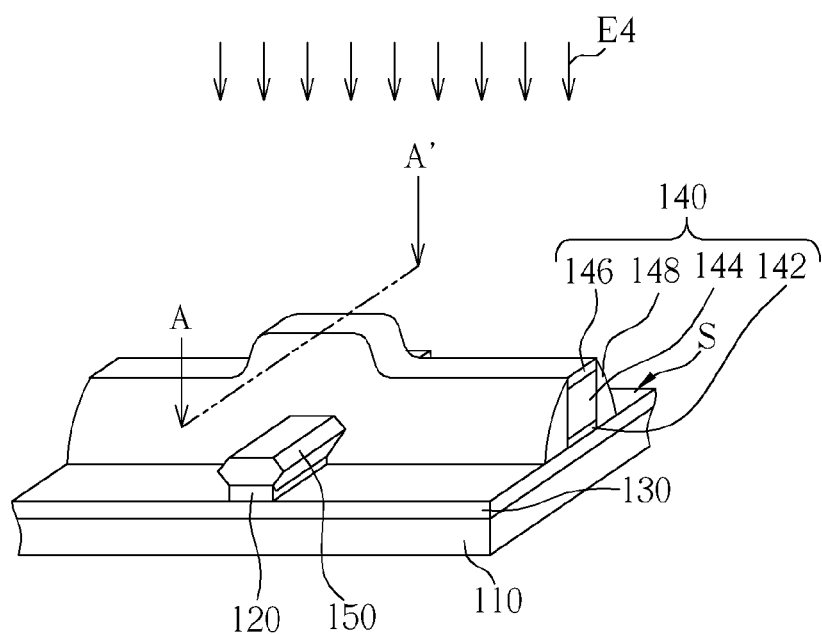

As shown in FIG. 8, an epitaxial process E4 is performed to form an epitaxial layer 150 having a hexagon-shaped profile structure in the recess R. The epitaxial layer 150 may include a silicon-germanium epitaxial layer suited for a PMOS transistor, or a silicon-carbide epitaxial layer suited for an NMOS transistor, depending upon the electrical properties of the Multi-gate MOSFET. FIG. 10 schematically depicts a cross-sectional view of a semiconductor process along line A-A' and above the plane S of FIG. 8. The epitaxial layer 150 is formed in the recess R, and grows conformally along the shape of the recess R, therefore having a hexagon-shaped profile structure. In a preferred embodiment, the level of the top surface S1 of the epitaxial layer 150 is higher than the level of the top surface S2 of the fin-shaped structure 120.

Thereafter, an ion implantation process may be performed to dope impurities, or impurities may be doped while performing the epitaxial process E4, so that the epitaxial layer 150 can be used as a source/drain region. After the epitaxial layer 150 is formed, a silicide process (or a salicide process, not shown) may be performed to form silicide in the source/drain region, wherein the silicide process may include a post clean process, a metal depositing process, an annealing process, a selective etching process, or a test process, etc. Thereafter, other processes may be performed after the silicide process is performed.

Above all, the present invention provides a semiconductor process that etches and forms at least a recess having a specific profile structure in the fin-shaped structure beside the gate, wherein the etching methods may include a dry etching process or a wet etching process. Preferably, the wet etching process comprises etching by an etchant containing ammonia, hydrogen peroxide and water. The epitaxial layer formed in the recess R has a hexagon-shaped profile structure and therefore improves performance of the semiconductor structure. For instance, after the epitaxial layer is formed, the spacer can be removed more easily. The epitaxial layer formed in the present invention makes it easier to force stress to the gate channel below the gate structure and enhance the carrier mobility of the gate channel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   providing a substrate;
   forming at least a fin-shaped structure on the substrate;
   forming an oxide layer on the substrate without the fin-shaped structure being formed thereon;

forming a gate covering a part of the oxide layer and a part of the fin-shaped structure;
performing an etching process to etch a part of the fin-shaped structure beside the gate to form at least a hexagon-shaped recess in the fin-shaped structure; and
performing an epitaxial process to form an epitaxial layer in the hexagon-shaped recess, wherein the epitaxial layer has a hexagon-shaped profile structure.

2. The semiconductor process according to claim 1, wherein the substrate comprises a bulk substrate or a silicon-on-insulator substrate.

3. The semiconductor process according to claim 2, wherein the steps of forming the fin-shaped structure comprise:
   forming a mask layer on the bulk substrate;
   performing a photolithography process to pattern the mask layer and expose a part of the bulk substrate; and
   performing an epitaxial process to form the fin-shaped structure on the exposed part of the bulk substrate.

4. The semiconductor process according to claim 3, wherein the mask layer comprises a pad oxide layer and a nitride layer.

5. The semiconductor process according to claim 2, wherein the silicon-on-insulator substrate comprises:
   a silicon substrate;
   a bottom oxide layer located on the silicon substrate; and
   a silicon layer located on the bottom oxide layer.

6. The semiconductor process according to claim 5, wherein the steps of forming the fin-shaped structure on the silicon-on-insulator substrate and forming the oxide layer on the substrate without the fin-shaped structure being formed thereon comprise:
   patterning the silicon layer to form the fin-shaped structure, and exposing a part of the bottom oxide layer on the substrate without the fin-shaped structure being formed thereon.

7. The semiconductor process according to claim 1, wherein forming the gate comprises:
   forming a gate dielectric layer covering the oxide layer and the fin-shaped structure;
   forming a gate electrode layer covering the gate dielectric layer;
   forming a cap layer covering the gate electrode layer;
   patterning the cap layer, the gate electrode layer and the gate dielectric layer; and
   forming a spacer beside the patterned gate dielectric layer, gate electrode layer and cap layer.

8. The semiconductor process according to claim 7, wherein the gate electrode layer comprises a polysilicon electrode layer.

9. The semiconductor process according to claim 8, further comprising:
   performing a replacement metal gate (RMG) process to replace the polysilicon electrode layer with a metal electrode layer.

10. The semiconductor process according to claim 1, wherein the etching process comprises a dry etching process or a wet etching process.

11. The semiconductor process according to claim 10, wherein the etching process comprises a dry etching process and a wet etching process.

12. The semiconductor process according to claim 10, wherein the wet etching process comprises etching by an etchant containing ammonia, hydrogen peroxide and water.

13. The semiconductor process according to claim 1, wherein the epitaxial process comprises a silicon-germanium epitaxial layer or a silicon-carbide epitaxial layer.

* * * * *